US012684727B2

(12) United States Patent
Sauerbrier

(10) Patent No.: US 12,684,727 B2
(45) Date of Patent: Jul. 14, 2026

(54) POWER SEMICONDUCTOR MODULE AND DRIVETRAIN FOR A VEHICLE COMPRISING SUCH A POWER SEMICONDUCTOR MODULE

(71) Applicant: Vitesco Technologies Germany GmbH, Regensburg (DE)

(72) Inventor: Jürgen Sauerbrier, Dachsbach (DE)

(73) Assignee: VITESCO TECHNOLOGIES GERMANY GMBH, Regensburg (DE)

( * ) Notice: Subject to any disclaimer, the term of this patent is extended or adjusted under 35 U.S.C. 154(b) by 254 days.

(21) Appl. No.: 18/693,324

(22) PCT Filed: Sep. 21, 2022

(86) PCT No.: PCT/EP2022/076233
§ 371 (c)(1),
(2) Date: Mar. 19, 2024

(87) PCT Pub. No.: WO2023/046757
PCT Pub. Date: Mar. 30, 2023

(65) Prior Publication Data
US 2024/0431062 A1 Dec. 26, 2024

(30) Foreign Application Priority Data
Sep. 23, 2021 (DE) .................... 10 2021 210 597.1

(51) Int. Cl.
*H05K 7/14* (2006.01)
*H05K 7/20* (2006.01)

(52) U.S. Cl.
CPC ......... *H05K 7/14329* (2022.08); *H05K 7/209* (2013.01); *H05K 7/20927* (2013.01)

(58) Field of Classification Search
CPC . H05K 7/14329; H05K 7/209; H05K 7/20927
See application file for complete search history.

(56) References Cited

U.S. PATENT DOCUMENTS 11,206,729 B2 * 12/2021 Sato ........................ H02M 3/28
2009/0262503 A1 10/2009 Kaneko ........................ 361/706
(Continued)

FOREIGN PATENT DOCUMENTS

DE 10 2013 209 444 11/2014 ............. H01L 23/46
DE 10 2016 204 460 9/2017 ............. H02M 1/00
(Continued)

OTHER PUBLICATIONS

Maier, Thomas, "Power Module With Housed Power Semiconductors For Controllable Electrical Power Supply To A Consumer", Oct. 29, 2020, ZF FRIEDRICHSHAFEN AG, Entire Document (Translation of DE102019205772). (Year: 2020).*
(Continued)

*Primary Examiner* — Stephen S Sul
(74) *Attorney, Agent, or Firm* — Slayden Grubert Beard PLLC

(57) ABSTRACT

Various embodiments of the teachings herein include a power semiconductor module. An example may include: a substrate; an electric circuit arranged on the substrate; a conductor frame including a DC+ busbar and a DC− busbar for external contacts; and an encapsulation material at least partially encapsulating the power semiconductor module. The electric circuit includes a power semiconductor component and a capacitor fastened on the busbars in thermal contact with a heat dissipator extending through the substrate.

15 Claims, 3 Drawing Sheets

(56)                  References Cited

U.S. PATENT DOCUMENTS

| | | | | |
|---|---|---|---|---|
| 2018/0103536 A1* | 4/2018 | Pickering | ............. | H05K 1/0206 |
| 2018/0331012 A1* | 11/2018 | Shimakawa | ......... | B62D 5/0481 |
| 2019/0246487 A1* | 8/2019 | Ito | ..................... | H05K 7/14322 |
| 2019/0335577 A1 | 10/2019 | Götz et al. | | |
| 2021/0144887 A1 | 5/2021 | Hoyler | | |
| 2022/0285173 A1 | 9/2022 | Schmidt et al. | | |
| 2024/0373544 A1* | 11/2024 | Afsharian | .............. | H05K 1/021 |
| 2025/0081328 A1* | 3/2025 | Afsharian | ............ | H05K 1/0206 |

FOREIGN PATENT DOCUMENTS

| | | | | |
|---|---|---|---|---|
| DE | 102019205772 A1 * | 10/2020 | ......... | H05K 7/14329 |
| EP | 3 654 741 | 5/2020 | ............... | H05K 5/06 |
| KR | 20190124146 A | 11/2019 | .......... | H01L 23/373 |
| KR | 20200135848 A | 12/2020 | ............ | H01L 23/00 |
| KR | 20210008366 A | 1/2021 | .............. | H05K 7/20 |
| WO | 2012 046153 | 4/2012 | .............. | H05K 7/14 |

OTHER PUBLICATIONS

Search Report for International Application No. PCT/EP2022/076233, 9 pages, Feb. 13, 2023.
Office Action for DE Application No. 10 2021 210 597.1, 5 pages, Sep. 15, 2022.
Office Action for DE Application No. 10 2021 210 597.1, 3 pages, Jan. 17, 2023.
Korean Office Action, Application No. 10-2024-7011422, 12 pages, Jun. 16, 2025.

* cited by examiner

POWER SEMICONDUCTOR MODULE AND DRIVETRAIN FOR A VEHICLE COMPRISING SUCH A POWER SEMICONDUCTOR MODULE

CROSS-REFERENCE TO RELATED APPLICATIONS

This application is a U.S. National Stage Application of International Application No. PCT/EP2022/076233 filed Sep. 21, 2022, which designates the United States of America, and claims priority to DE Application No. 10 2021 210 597.1 filed Sep. 23, 2021, the contents of which are hereby incorporated by reference in their entirety.

TECHNICAL FIELD

The present disclosure relates to power semiconductor modules. Various embodiments of the teachings herein include a power semiconductor module having an at least partially housed circuit comprising at least one capacitor, controllers for a drivetrain for an electrically drivable vehicle, drivetrain for an electrically drivable vehicle, and/or electrically drivable vehicles.

BACKGROUND

Printed circuit boards or controllers in the automotive area for applications with a 48 V inverter typically have a baseplate and housing. Higher integrated applications use the so-called "embedded" technology. In embedded technology, bare die MOSFETs produced especially for this type of construction technology are used. There are also applications which use an "isolated metal substrate" having housed components as the circuit carrier. An additional expenditure with regard to the substrate size is the arrangement of the required capacitances, in particular of electrolyte capacitors.

DE 42 44 721 A1 describes an electric machine, the windings of which are connected to controllable semiconductor valves, in particular in the form of power transistors. The windings are in heat exchange contact with a fluid cooling arrangement, in the cooling fluid channel of which, unified with the windings into a structural unit, the cooling arrangement generates a forced flow of a cooling fluid, in particular a cooling liquid. The semiconductor valves are also part of the structural unit and are also in heat exchange contact with the cooling fluid in the cooling fluid channel.

SUMMARY

Such solutions can be improved still further, however, in particular with regard to cost-effective and simple production and/or with regard to the possible reduction of spatial restrictions with good cooling at the same time. Teachings of the present disclosure include improvements for a power semiconductor module with respect to the producibility and/or with respect to the structure with good cooling and correspondingly good performance data. For example, some embodiments include a power semiconductor module (10), comprising a substrate (12), on which an electric circuit (14) is arranged, wherein the electric circuit (14) has at least one power semiconductor component (16), wherein the power semiconductor module (10) comprises a conductor frame having a DC+ busbar (18) and a DC− busbar (20) for externally contacting the power semiconductor module (10), wherein the electric circuit (14) furthermore has at least one capacitor (26), and wherein the power semiconductor module (10) is at least partially encapsulated by an encapsulation material (36), characterized in that the at least one capacitor (26) is fastened on the busbars and is in thermal contact in the sense of heat conduction with a heat dissipator (28) extending through the substrate (12).

In some embodiments, the heat dissipator (28) is in thermal contact in the sense of heat conduction with at least one power semiconductor component (16).

In some embodiments, the heat dissipator (28) or a part connected thereto in the sense of heat conduction cools at least one power semiconductor component (16) from its lower side.

In some embodiments, the heat dissipator (28) comprises a plurality of holes (30) through the substrate (12), which are filled with a heat dissipation material (32).

In some embodiments, the heat dissipation material (32) is selected from metals and plastics.

In some embodiments, at least one power semiconductor component (16) is cooled by a cooling channel (40) for a cooling fluid, which is positioned opposite to at least one power semiconductor component (16) with respect to the substrate (12).

In some embodiments, the cooling channel is provided between the substrate (12) and the encapsulation material (36) and is open toward the substrate (12).

In some embodiments, structures (52) for generating turbulence in a cooling fluid are provided at a delimitation of the cooling channel (40).

In some embodiments, the structures (52) are embossed into a delimitation of the cooling channel (40).

In some embodiments, the encapsulation material (36) has external cooling structures (38).

In some embodiments, the external cooling structures (38) are provided adjacent to the power semiconductor component (16) and opposite to the cooling channel (40) such that the cooling structures (38) cool at least one power semiconductor component (16) from its upper side.

In some embodiments, the thermal contact between the at least one capacitor (26) and heat dissipator (28) is formed by a thermally conductive intermediate material (34).

In some embodiments, at least one capacitor (26) is welded to the busbars.

As another example, some embodiments include a drivetrain (54) for an electrically drivable vehicle, comprising a voltage source (56), a power semiconductor module (10), and an electric motor (58), characterized in that the power semiconductor module (10) is designed as described herein.

As another example, some embodiments include a controller for a drivetrain (54) for an electrically drivable vehicle, comprising a power semiconductor module (10), characterized in that the power semiconductor module (10) is designed as described herein.

As another example, some embodiments include an electrically drivable vehicle, characterized in that the electrically drivable vehicle has at least one of a power semiconductor module (10) as described herein, a drivetrain (54) as described herein, and a controller as described herein.

BRIEF DESCRIPTION OF THE DRAWINGS

The teachings herein are explained in more detail hereinafter on the basis of the figures, wherein individual or multiple features of the figures can be a feature of the invention as such or in combination. Furthermore, the figures are only to be viewed as examples but in no way restrictive. In the figures.

DETAILED DESCRIPTION

Figure 1:
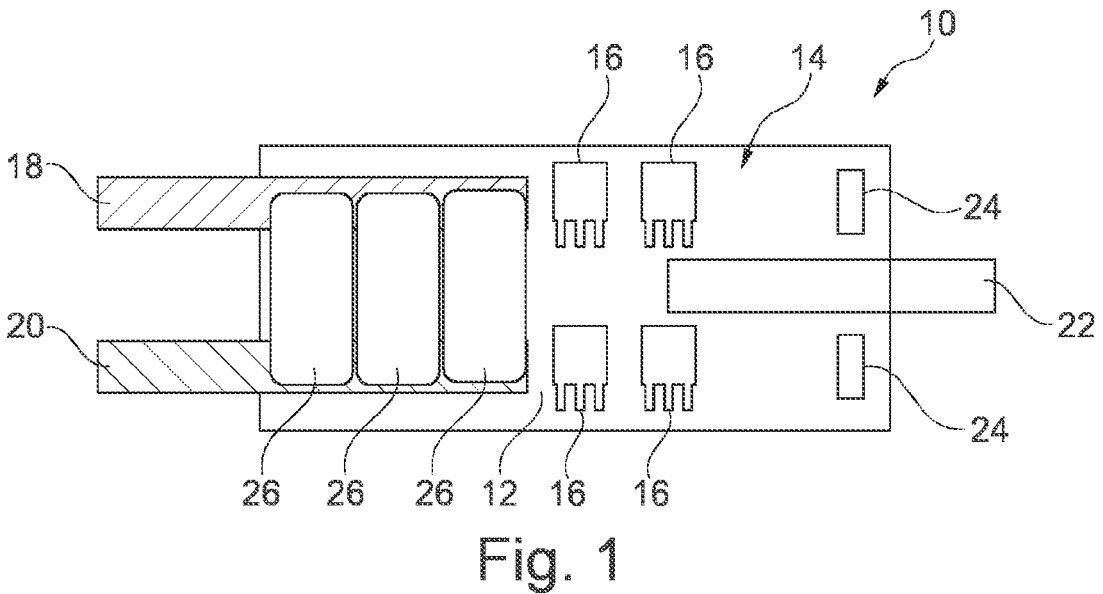
FIG. 1 shows a schematic top view of an example power semiconductor module incorporating teachings O f the present disclosure.

The subject matter of the present disclosure includes power semiconductor modules. An example module incorporating teachings of the present disclosure includes a substrate on which an electric circuit is arranged, wherein the electric circuit has at least one power semiconductor component, wherein the power semiconductor module comprises a conductor frame having a DC+ busbar and a DC− busbar for externally contacting the power semiconductor module, wherein the electric circuit furthermore has at least one capacitor, and wherein the power semiconductor module is at least partially housed by a encapsulation material, wherein the at least one capacitor is fastened to the busbars and is in thermal contact in the sense of heat conduction with a heat dissipator extending through the substrate.

Such a power semiconductor module can have significant advantages over the solutions from the prior art, in particular with respect to the producibility and/or with respect to the structure with good cooling and correspondingly good performance data.

A power semiconductor module is one which, according to a definition known as such to a person skilled in the art, has at least one semiconductor component designed for controlling and/or switching high electric currents and voltages. High currents and voltages are to be understood here in particular as currents of more than 1 A and voltages of more than approximately 24 V. In particular, the power semiconductor module described here can be used to control an electric motor, as is described later in greater detail.

The power semiconductor module has a substrate on which an electric circuit is arranged. For this purpose, the substrate in particular has an electrically insulating base structure, on which the circuit is positioned and interconnected accordingly. For example, the substrate is a printed circuit board known per se, which is made, for example, of FR4. In a way known per se, FR4 is a class of poorly combustible and flame retardant composite materials, comprising epoxy resin and glass fiber fabric. The substrate can have, for example, electric conductor tracks and/or can possibly be provided with metallizations.

The specific positioning and interconnection of the electric circuit can be implemented in a way readily known to a person skilled in the art in consideration of the desired application.

The electric circuit has at least one power semiconductor component, e.g., a plurality of power semiconductor components, which is again selected in accordance with the desired application. For example, an inverter can be formed, for which purpose the component or components can comprise, for example, power transistors, for example from the group comprising bipolar transistors, MOSFET, and/or IGBT. At least one power semiconductor component preferably comprises a MOSFET.

The power semiconductor module comprises a conductor frame having a DC+ busbar and a DC− busbar for externally contacting the power semiconductor module. Such busbars can also be designated as a lead frame or busbar and in addition to the DC+ busbar and the DC− busbar, which are used for contacting with a voltage source or battery, can have still a further busbar for connection to a 3-phase motor. For example, the busbars can be designed as so-called press fit connections.

In addition, the circuit has at least one capacitor, in particular a plurality of capacitors. These can be designed, for example, as electrolyte capacitors. Furthermore, further active or passive components, such as resistors, can be present without being mentioned separately.

In some embodiments, the capacitor or capacitors is/are fastened on the busbars and is/are in thermal contact in the sense of heat conduction with a heat dissipator extending through the substrate.

This design allows a space-saving arrangement and an efficient cooling concept at the same time.

The at least one capacitor is thus fastened both on the DC+ busbar and on the DC− busbar. No further space requirement thus has to be kept free for the capacitors on the substrate or on the printed circuit board. Small space requirements can thus be observed and installation space can be saved, in particular in contrast to a design in which the capacitors are arranged in a typical manner adjacent to the busbars on the substrate.

To enable efficient cooling, the capacitors are in thermal contact in the sense of heat conduction with a heat dissipator extending to the substrate. A heat dissipator can be understood here in the meaning of the present disclosure as an area which has a higher thermal conductivity than the material of the substrate. Cooling of the capacitances or the capacitors can thus take place in an efficient manner through the heat dissipator. In this way, no space has to be kept free on the upper side of the substrate for cooling directly at the capacitors. In contrast thereto, it can be made possible that heat arising during operation is dissipated through the substrate on the lower side. Since usually no active components are present on the lower side of the substrate, the cooling can be provided here without problems. This can furthermore be advantageous if the module is at least partially encapsulated by a encapsulation material, since in the case of lower-side cooling no consideration has to be taken thereof, as is described in greater detail hereinafter.

Therefore, effective cooling with a reduced space requirement at the same time can be enabled by this design. In addition, it can thus be possible in a particularly simple manner to use corresponding cooling both for capacitors and for existing power semiconductor components, as is described hereinafter in greater detail. This is possible, for example, in that a cooling element is provided, for example, below the substrate, which thermally connects the capacitors and the power semiconductor components, for example with the aid of further elements, such as heat dissipators or further holes having thermally conductive material.

With respect to the performance data, the circuit can thus be designed such that it produces a greater amount of heat under operating conditions. This can nonetheless be dissipated well by a very effective heat removal concept of the present invention. In particular, improved cooling can furthermore have a positive effect on the service life, so that the total service life can be improved. In addition, the susceptibility to failure can be reduced, which can permit a gain in reliability.

In some embodiments, the power semiconductor module is at least partially encapsulated by a encapsulation material. For example, the encapsulation material can be a potting compound or another material which is applied directly on at least a part of the electric circuit and can harden there, for example, or also a ceramic material. The encapsulation material may be a polymer, however. Encapsulation results in the encapsulation material being in direct contact at least with a part of the circuit. In some embodiments, the encapsulation material can be directly in contact with power semiconductor components or also with bond wires used for interconnecting the components.

The encapsulation material protects the electric circuit from external influences, in particular such as moisture, dust, or also mechanical influences, in order to thus exist in rough surroundings, for example as are present in an automatic transmission. Transmission oil contact can thus be permitted and a protection from corrosion can be provided, for example.

In some embodiments, due to the provision of the encapsulation material, the use of an additional housing surrounding the electric circuit can be omitted, so that the power semiconductor module can be designed housing-free. In addition, the encapsulation material offers mechanical stability of the power semiconductor module, so that providing base plates or similar components which serve for the stability of the module can be omitted or such components can at least be reduced or formed lighter and/or with less material.

In some embodiments, the encapsulation material comprises a thermally conductive filler. The filler can improve the thermal conductivity, in particular in relation to a pure encapsulation material, which can in turn result in improved heat dissipation and thus improved cooling of the circuit. A thermally conductive filler is in particular one which has better thermal conductivity than the pure encapsulation material. The specific selection of the filler can be selected against the background of the desired application and the desired thermal and mechanical properties as well as any cost specifications.

In some embodiments, the encapsulation material is a thermosetting material. Thermosetting materials offer a combination of processing capability and available properties as the encapsulation material. With respect to the processing capability, thermosetting materials are usually usable as potting compounds before they reach their thermoset state. They are thus well suitable for at least partially encapsulating the electric circuit. In addition, it is thus possible to introduce highly definable and reproducible cooling structures both as an internal structure and as an external structure. This is because, for example, placeholders, such as so-called heat pipes, are embedded for internal structures, for example, which create the shape of the cooling structure. The external structures can be created, for example, by shaping tools or can also be creatable by corresponding placeholders.

With respect to the achievable properties, thermosetting materials may offer a high level of stability and hardness and usually very good media resistance, so that a high level of protection of the electric circuit is combinable with the problem-free use for guiding a coolant. Improved robustness may result in relation to thermal, mechanical, and chemical interfering influences in spite of dispensing with the housing solutions typical in the branch. Accompanying this, improved robustness of the structure and connection technology is achieved over the entire service life.

Due to the encapsulation material, the power semiconductor module as described enables a reduction of the costs while maintaining given requirements and restrictions with respect to the thermal management. Higher component expenditure and a strong spatial restriction of the electronic assembly parts can be avoided, since they can be protected gas-tightly and in consideration, for example, of targeted protection of the component solder points.

Components such as aluminum base plates for mechanical stabilization, thermal interface material, housing, etc. can be at least partially omitted. A reduction of the overall cost and the weight and simplification of the production follow therefrom, as already mentioned. The latter can be used in particular in mobile applications, for example, upon the use of the power semiconductor module in an electrically driven vehicle, for example, as a controller or as part thereof for a drivetrain of the vehicle.

In some embodiments, the heat dissipator can be in thermal contact in terms of heat conduction with at least one power semiconductor component, or with all power semiconductor components, allowing efficient component integration. The power semiconductor components often require effective cooling to permit high performance data and good long-term stability of the module. If the components provided for this purpose are also used for the cooling of the capacitor or capacitors, the number of components can thus be reduced and weight and installation space requirement can be kept low.

In some embodiments, the heat dissipation or a part connected thereto in terms of heat conduction cools at least one power semiconductor component from its lower side. The lower side of the power semiconductor component is in particular to be the side here which is directed toward the substrate, such as the printed circuit board. The advantage of cooling from the lower side is that there are usually no active components present below the substrate. The embodiment in this area of the module can therefore be adapted to work particularly effectively. Taking into consideration possibly existing further components thus does not have to be implemented. Effective cooling can thus be combined with a very small space requirement. Such cooling can be possible through the substrate as such, or, for example, through holes in the substrate which are filled with a material having good thermal conductivity. The holes can thus be designed in accordance with the described heat dissipators.

In some embodiments, the heat dissipator has a plurality of holes through the substrate which are filled with a heat dissipation material. The substrate can have so-called "thermovias" in the areas of the capacitors. Such means can dissipate the heat particularly effectively and are easily implementable in production.

In some embodiments, the heat dissipation material can be selected from the group consisting of metals and plastics, in particular epoxy resins. Metals, such as copper, can already have good thermal conductivity as such. This can also apply to epoxy resins, wherein the thermal conductivity can be further improved by corresponding fillers known to a person skilled in the art. Examples of such fillers comprise, for example, metal particles, ceramic particles, or other substances which have better thermal conductivity than the corresponding matrix material.

In some embodiments, at least one power semiconductor component, or all power semiconductor components can be cooled by a cooling channel for a cooling fluid, which is positioned opposite to at least one power semiconductor component with respect to the substrate. The cooling channel can thus act on the power semiconductor component, so that the thermal management is effective overall and high performance is achievable. Positioning opposite to at least one power semiconductor component means here in particular that the cooling channel is present at such a position on the cooling element, at which at least one power semiconductor component is positioned opposite to the cooling element, thus the cooling channel and the power semiconductor component are arranged in particular in a plane extending perpendicularly to the cooling element. The cooling channel can thus cool the power semiconductor component from its lower side.

In some embodiments, the cooling channel or a cooling channel can also be present adjacent to or opposite to the heat dissipator and/or opposite to the busbars and can thus cool the capacitors. The thermal management can thus be further improved. The cooling channel can be between the substrate and the encapsulation material and can be open toward the substrate.

The cooling channel can thus be directly formed by the encapsulation material, or before the application of the encapsulation material, a delimitation directly surrounding the cooling channel, also referred to as an insert, can be placed on the substrate, which is subsequently encapsulated by the encapsulation material. The space requirement for the cooling channel is kept particularly small. In addition, the cooling channel can be tailored in a simple manner to the specific requirements, which also makes the cooling effect very positive. In addition, the cooling fluid, such as water or oil, can flow directly along the substrate through an opening of the cooling channel to the cooling element, which makes the removal of heat particularly effective.

In some embodiments, structures for generating turbulence in a cooling fluid can be provided on a delimitation of the cooling channel. A particularly effective cooling effect can in turn be enabled since the cooling fluid flowing through the cooling channel in particular flows turbulently along the substrate. For example, the cooling structures can be embossed in the substrate, for example, the circuit board, or another delimitation of the cooling channel, such as the insert part or the cooling element. This permits a high degree of freedom in the structures formed with easy producibility.

In some embodiments, to enable cooling of the power semiconductor module, the encapsulation material has external cooling structures, thus such cooling structures which are directed into the external surroundings of the module. This allows the encapsulation material to be used not only to provide mechanical stability and protect the electrical circuit from external influences, but also to be part of the heat removal concept of the assembly. The heat removal or the dissipation of heat from the electric circuit can thus take place particularly effectively and without the necessity of complex further components. Performance data and producibility of the power semiconductor module may be further improved in this way.

In some embodiments, the external cooling structure comprise cooling ribs. Structures can therefore be provided in particular on the surface which enlarge the surface in comparison to a smooth surface. For example, the cooling ribs can be formed in a way known per se by the formation of a large number of adjacent ribs, also known as a comb structure. Passive cooling can thus be generated, by which heat can be emitted to the atmosphere surrounding the cooling structure. For example, in the specific application, air can be present as a cooling atmosphere adjacent to the cooling ribs. Without further active elements, cooling or heat dissipation can take place directly through the embodiment of the surface structure of the encapsulation material, so that further active components can be omitted.

In some embodiments, the cooling structures can be adjacent to the power semiconductor component and opposite to the cooling channel such that the cooling structures cool at least one power semiconductor component, for example, all power semiconductor components, from its or their upper side. This can further improve the effectiveness of the cooling, since the power semiconductor component can now be cooled from its upper side and from its lower side. The above-described advantages enabled by effective cooling can thus be enabled particularly effectively.

In some embodiments, the thermal contact between the at least one capacitor and the heat dissipation unit is formed by a thermally conductive intermediate material. Thermally conductive intermediate materials, also referred to as thermally conductive interface materials (TIM), are applied to fill air gaps and thus improve the heat conduction and therefore the dissipation of the heat which arises due to the electrical operation. For example, thermally conductive insulators and thermally conductive pastes can be used. In some embodiments, thermally conductive pastes can be used which are electrically insulating. Thermal conductivity values can be achieved in a range of $\geq 3$ W/mK, such as $\leq 10$ W/mK, for example of $\geq 4$ W/mK, such as $\leq 7$ W/mK. For example, so-called liquid dispensed silicone thermal pads, gap filler, or silicone-based conductive sheets, so-called thermal pads, which are known to a person skilled in the art under these names, can serve as examples of such materials.

In some embodiments, at least one capacitor can be welded to the busbars. Contact of the capacitor with the busbars can be produced in a simple and nonetheless very stable manner. The long-term stability of the module can thus be improved.

With respect to further advantages and technical features of the power semiconductor module, reference is made to the description of the drivetrain, the vehicle, the controller, to the figures, and to the description of the figures, and vice versa.

Furthermore, a drivetrain for an electrically drivable vehicle may include a voltage source, a power semiconductor module, and an electric motor, wherein the power semiconductor module is embodied in particular as described herein. Such a drivetrain can be advantageous in particular for an electrically driven or drivable vehicle, such as a solely electric vehicle, a hybrid vehicle, or also a mild hybrid vehicle, which only provides recuperated energy, for example.

The voltage source, in particular a battery, can be a battery known per se such as a lithium-ion accumulator in particular and can provide, for example, a voltage in a range of 48 V, which is applied to the power semiconductor module, in particular inverter. The electric circuit can accordingly form an inverter. In some embodiments, the inverter converts an input voltage of at least 30 V, for example 48 V, into an AC voltage.

The circuit or the power semiconductor module may be part of the drivetrain of an electrically driven vehicle. Up to this point differing solutions, such as housing-based solutions, have been implemented. The teachings of the present disclosure can thus come to bear particularly effectively in particular with such an inverter. In addition, the thermal management is of great importance in particular in inverters, so that improved solutions for cooling are important in particular in inverters, for example in the drivetrain of an electrically driven vehicle.

The inverter can invert the current into AC voltage, for example, and supply the electric motor, such as a three-phase electric motor. This in turn can be used to drive the vehicle. The power semiconductor module can therefore be referred to as a controller or as a controller for the electric motor or can form this jointly with a microcontroller. The use of the power semiconductor modules described herein offers potential advantages as described above with respect to a reduced installation space requirement and efficient cooling with low costs at the same time. Furthermore, an integrated solution of the controller can also be used and can be possible due to a use in rough or harsh surroundings.

In some embodiments, a controller for a drivetrain for an electrically drivable vehicle includes a power semiconductor module, wherein the power semiconductor module is as described above. In some embodiments, such a controller has, in addition to the power semiconductor module, a microcontroller for activating the power semiconductor module. In some embodiments, the controller forms such an inverter which is designed to convert an input voltage of at least 30 V, for example a 48 V, into an AC voltage. In particular in inverters, the thermal management is of great importance, so that improved solutions for cooling are important in particular in inverters, for example in the drivetrain of an electrically driven vehicle. This may result in a reduced installation space requirement and efficient cooling with low costs at the same time. Furthermore, an integrated solution of the controller can also be used and can be possible due to a use in rough or harsh surroundings.

Some embodiments include an electrically drivable vehicle, wherein the electrically drivable vehicle has at least one of a power semiconductor module and a drivetrain and a controller as described herein. The vehicle can be, for example, a completely electrically drivable vehicle or a hybrid vehicle or also a mild hybrid vehicle. For example, the vehicle can be a motor vehicle, such as a passenger vehicle, or a truck or a bus. In particular, the vehicle can be a utility vehicle which is usable in rough surroundings. Furthermore, however, the vehicle can also be any other land vehicle, water vehicle, in particular ship, or also aircraft, such as an airplane or a vehicle from the area of space travel. The vehicle may have the above-mentioned advantages here, according to which the vehicle has advantages with respect to the thermal management and the installation space requirement with low costs at the same time due to the embodiment of the power semiconductor module or of the drivetrain having the semiconductor module or the controller.

FIG. 1 shows a top view of an example power semiconductor module 10 incorporating teachings of the present disclosure. Such a power semiconductor module 10 can be used in particular in a controller of a drivetrain of an electrically drivable vehicle. As shown hereinafter, a substrate 12 of the power semiconductor module 10 is designed in the area of the components necessary for the activation of a 3-phase motor so that optimum thermal heat removal, in particular through the substrate 12, is ensured.

FIG. 1 shows that the power semiconductor module 10 has a substrate 12. The substrate 12 can in particular be a printed circuit board, for example, formed from FR4. The printed circuit board can be designed as single-layer or multilayer. An electric circuit 14 is arranged on the substrate 12, wherein the electric circuit 14 has at least one power semiconductor component 16. In the embodiment according to FIG. 1, four power semiconductor components 16 are provided, which can in particular be MOSFETs.

It is furthermore shown that the power semiconductor module 10 has a conductor frame, also designated as a lead frame, having a DC+ busbar 18 and a DC− busbar 20 for externally contacting the power semiconductor module 10. A further busbar is used as a busbar 22 for connection to a 3-phase motor. Furthermore, contacts 24 are provided in order to connect the power semiconductor module 10 to a microcontroller.

It is furthermore shown that the busbars are formed by means of a press-fit connection to the substrate 12. The busbars by means of press fit connections thus contact the substrate 12 or the printed circuit board and form the connection to the voltage source 56 and to the electric motor 58.

The electric circuit 14 furthermore comprises at least one capacitor 26, wherein three capacitors 26 are shown in FIG. 1. The capacitors 26 are fastened on the busbars, thus on the DC+ busbar 18 and the DC− busbar 20, in particular welded thereto.

Figure 2:
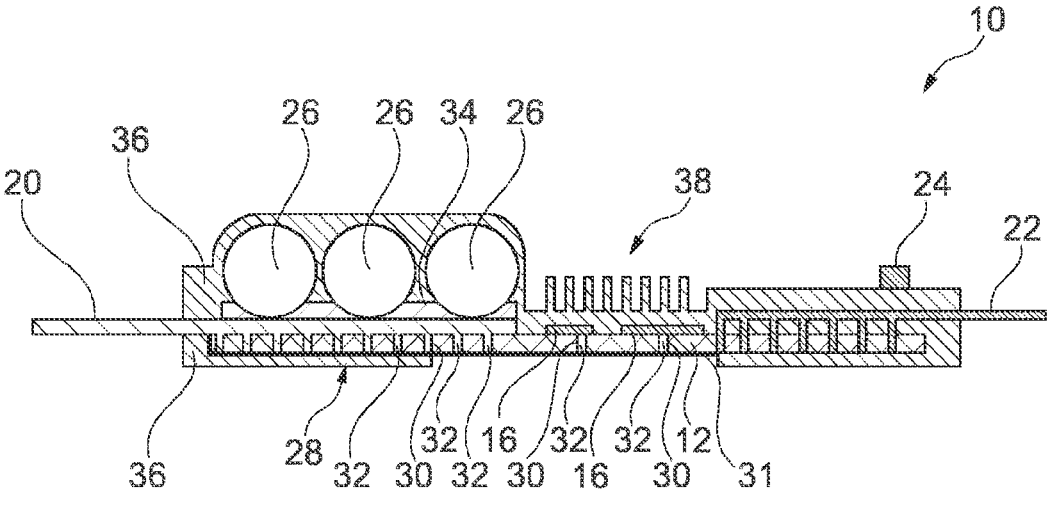
FIG. 2 shows a schematic sectional view through an example power semiconductor module incorporating teachings of the present disclosure.

FIG. 2 shows a sectional view of an example of a power semiconductor module 10 incorporating teachings of the present disclosure. FIG. 2 shows that the capacitors 26 are in thermal contact in terms of heat conduction with a heat dissipator 28 extending through the substrate 12. The heat dissipator 28 has a plurality of holes 30 in the substrate 12 or through the substrate 12, which are filled using a heat dissipation material 32. The heat dissipation material 32 can be selected here from metals or plastics, for example, filled with ceramic particles, for example. The thermal contact between the capacitors 26 and the heat dissipator 28 is furthermore formed by a thermally conductive intermediate material 34.

It is furthermore shown that the holes 30 or the heat dissipation material 32 are in thermal contact with a cooling element 31. This can dissipate the heat from the capacitors 26. For this purpose, it can be sufficient if one hole 30 connects the cooling element 31 to the thermally conductive intermediate material 34 in order to thus cool all capacitors 26. Alternatively, the cooling element 31 can also extend under all capacitors 26 and can be thermally connected to corresponding holes 30 under all capacitors 26.

It is furthermore shown that the cooling element 31 is in thermal contact in terms of heat conduction with the power semiconductor components 16 and can cool them in particular from the lower side thereof. For this purpose, holes 30 filled with a heat dissipation material 32 can again extend below the power semiconductor components 16 through the substrate 12.

In the embodiment according to FIG. 2, the power semiconductor module 10 is furthermore at least partially encapsulated by an encapsulation material 36. The encapsulation material 36 can have external cooling structures 38 here. In particular, the external cooling structures 38 are positioned adjacent to the power semiconductor components 16, so that they are provided such that the cooling structures 38 cool the power semiconductor components 16 from the upper side. In this embodiment, cooling of the power semiconductor components 16 can thus take place from the upper side and from the lower side.

Figure 3:
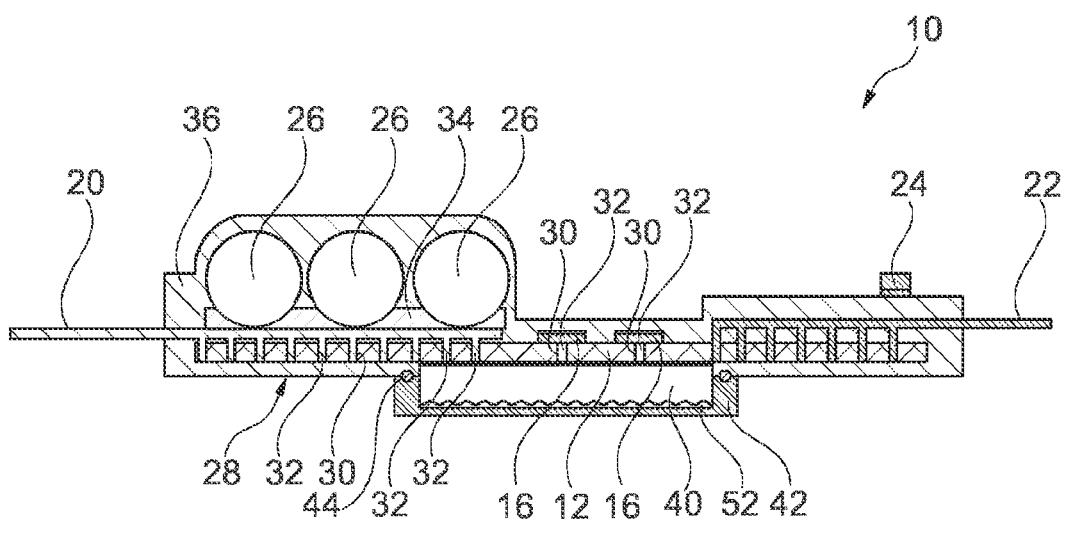
FIG. 3 shows a schematic sectional view through an example of an example power semiconductor module incorporating teachings of the present disclosure.

FIG. 3 shows a further example of a power semiconductor module 10 incorporating teachings of the present disclosure. In this embodiment, the power semiconductor components 16 are cooled by a cooling channel 40 for a cooling fluid. The cooling channel 40 is positioned with respect to the substrate 12 opposite to the power semiconductor components 16. The cooling channel 40 can in principle be formed, for example, by a structure 42 applied to the encapsulation material 36, which is sealed by seals 44 in relation to the encapsulation material 36. In particular, the cooling channel 40 is open toward the substrate 12. Furthermore, structures 52 for generating turbulence in a cooling fluid flowing through the cooling channel 40 can be provided in the cooling channel 40 or at a delimitation of the cooling channel 42. For example, the structures 52 are embossed into the substrate 12 or another delimitation of the cooling channel 40, such as the structure 42 or the insert part 46 described hereinafter in particular. In this embodiment, the cooling of the power semiconductor components 16 from the lower side can thus be improved.

In the embodiment according to FIG. 3, the cooling element 31 furthermore only extends inside the cooling channel 40 and therefore cools the power semiconductor components 16 and furthermore the capacitors 26 via the thermally conductive intermediate material 34 and the heat dissipator 28.

Figure 4:
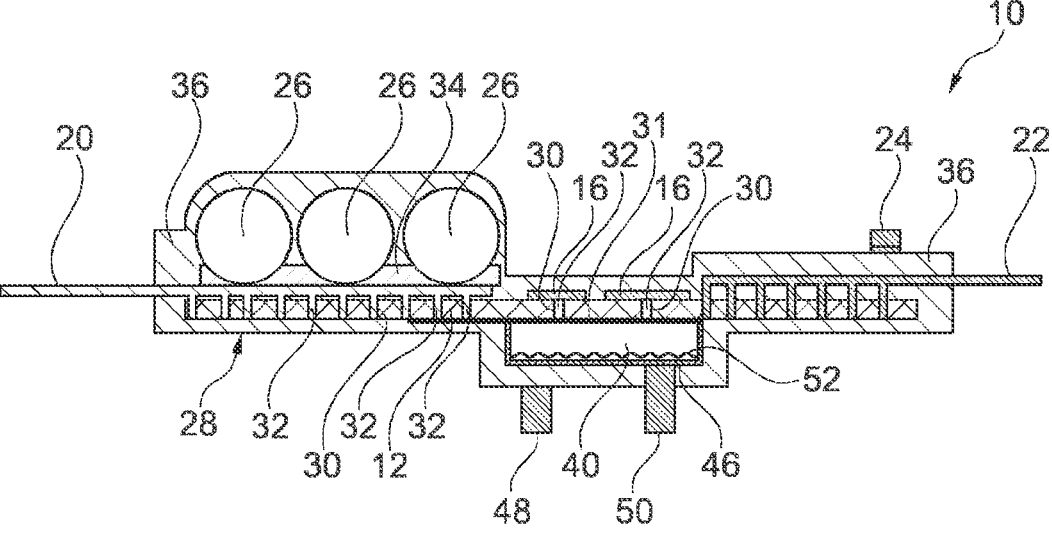
FIG. 4 shows a schematic sectional view through an example of a power semiconductor module incorporating teachings of the present disclosure.

FIG. 4 shows a further example having a cooling channel 40 modified in relation to FIG. 3. According to FIG. 4, the cooling channel 40 is arranged between the substrate 12 and the encapsulation material 36 and is open toward the substrate 12.

This is implementable in that an insert part 46 having inlet 48 and outlet 50 is used for the cooling fluid or for the cooling circuit, which forms a cavity between the substrate 12 and the envelope or the encapsulation material 36. In the following enveloping process, a media-tight cooling channel 40 thus results, which causes the cooling medium to flow directly along the substrate 12 and cool it and also the power semiconductor components 16. Corresponding seals 44 can thus be omitted and the production and longevity can be simplified. The insert part 46 can in turn be formed having structures 52 as flow geometries in order to generate a swirl of the cooling medium and increase the cooling effect. Such geometries can also be referred to as described above as structures 52 for generating turbulence in the cooling fluid. A complex metal cooler could thus be omitted, which would result in a savings in weight.

In the embodiment according to FIG. 4, the cooling element 31 furthermore extends inside and outside the cooling channel 40 up to below a capacitor 26 and cools the power semiconductor components 16 and furthermore the capacitors 26 via the thermally conductive intermediate material 34.

Figure 5:
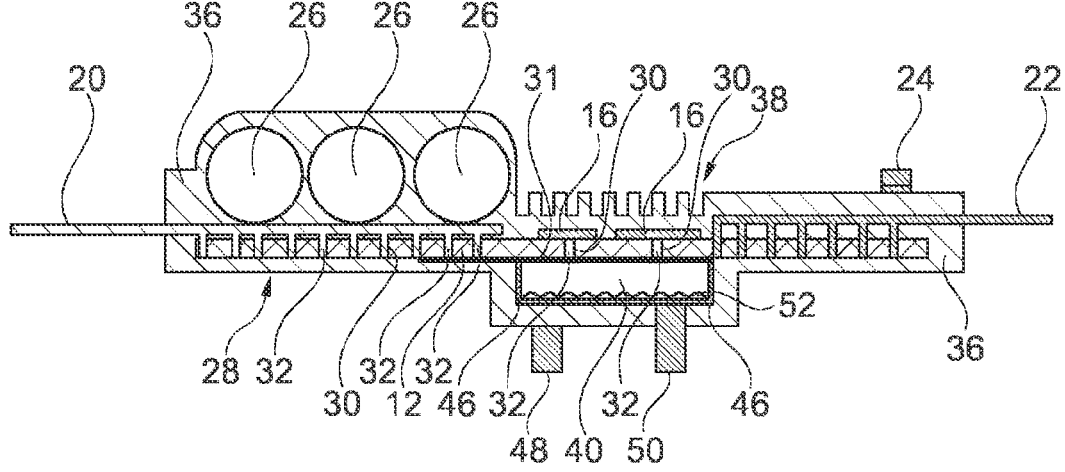
FIG. 5 shows a schematic sectional view through an example of a power semiconductor module incorporating teachings of the present disclosure.

FIG. 5 shows a further example which essentially corresponds to the embodiment from FIG. 4. However, it is shown that the encapsulation material 36 has external cooling structures 38, which are provided opposite to the cooling channel 40, in order to thus also improve cooling from the upper side for the power semiconductor components 16. In the embodiment according to FIG. 5, the cooling element 31 furthermore extends inside and outside the cooling channel 40 below a capacitor 26 and cools the power semiconductor components 16 and furthermore the capacitors 26 via the thermally conductive intermediate material 34.

Figure 6:
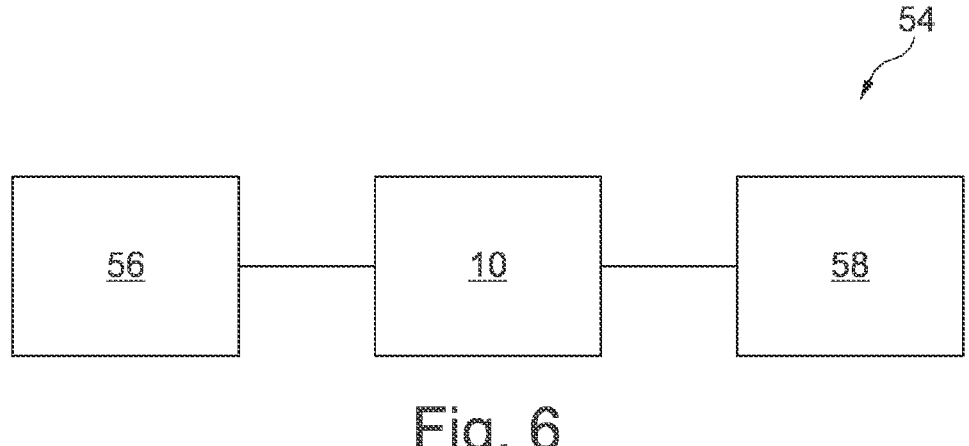
FIG. 6 shows a schematic of an example drivetrain having a power semiconductor module incorporating teachings of the present disclosure.

FIG. 6 shows an embedding of the power semiconductor module 10 in the drivetrain 54 of a motor vehicle. In the detail, a battery, such as a lithium-ion battery, is shown as the voltage source 56, which can provide a voltage of 48 V, for example, and is connected to a power semiconductor module 10. The power semiconductor module 10 can in particular form an inverter and can convert the DC voltage applied by the battery, which is used as the voltage source 56, into AC voltage. This can supply an electric motor 58, such as a three-phase motor. The power semiconductor module 10 together with a microcontroller is therefore a controller for the drivetrain 54.

What is claimed is:

1. A power semiconductor module comprising:
   a substrate;
   an electric circuit arranged on the substrate;
   wherein the electric circuit includes a power semiconductor component and a capacitor;
   a conductor frame including a DC+ busbar and a DC− busbar for external contacts; and
   an encapsulation material at least partially encapsulating the power semiconductor module;
   wherein the capacitor is fastened on the DC+ busbar and the DC− busbar and in thermal contact with a heat dissipator extending through the substrate.

2. The power semiconductor module as claimed in claim 1, wherein the heat dissipator is in thermal contact with the power semiconductor component.

3. The power semiconductor module as claimed in claim 2, wherein the heat dissipator or a part connected thereto cools the power semiconductor component from a side approximating the substrate.

4. The power semiconductor module as claimed in claim 1, wherein:
   the heat dissipator comprises a plurality of holes through the substrate, and
   individual holes of the plurality of holes are filled with a heat dissipation material.

5. The power semiconductor module as claimed in claim 4, wherein the heat dissipation material comprises a metal and/or a plastic.

6. The power semiconductor module as claimed in claim 1, wherein the power semiconductor component is cooled by a cooling channel for a cooling fluid, and the cooling channel is positioned opposite to the power semiconductor component with respect to the substrate.

7. The power semiconductor module as claimed in claim 6, wherein the cooling channel is defined within the encapsulation material and is open toward the substrate.

8. The power semiconductor module as claimed in claim 6, further comprising structures to generate turbulence in the cooling fluid while flowing through the cooling channel.

9. The power semiconductor module as claimed in claim 8, wherein the structures are embossed into a delimitation of the cooling channel.

10. The power semiconductor module as claimed in claim 1, wherein the encapsulation material includes external cooling structures.

11. The power semiconductor module as claimed in claim 10, wherein the external cooling structures are adjacent to the power semiconductor component and opposite to a cooling channel so the external cooling structures cool the power semiconductor component from its upper side.

12. The power semiconductor module as claimed in claim 1, wherein the thermal contact between the capacitor and the heat dissipator includes a thermally conductive intermediate material.

13. The power semiconductor module as claimed in claim 1, wherein the capacitor is welded to the DC+ busbar and to the DC− busbar.

14. A drivetrain for an electrically driven vehicle, the drivetrain comprising:
   a voltage source;
   a power semiconductor module connected to the voltage source; and

an electric motor energized by the power semiconductor module;

wherein the power semiconductor module comprises:
a substrate;
an electric circuit arranged on the substrate;
wherein the electric circuit includes a power semiconductor component and a capacitor;
a conductor frame including a DC+ busbar and a DC− busbar for external contact; and
an encapsulation material at least partially encapsulating the power semiconductor module;

wherein the capacitor is fastened on the DC+ busbar and the DC− busbar in thermal contact with a heat dissipator extending through the substrate.

15. An electrically drivable vehicle comprising:
a wheel;
a voltage source;

14 a power semiconductor module connected to the voltage source; and an electric motor driving the wheel by converting power delivered by the power semiconductor module;

wherein the power semiconductor module comprises:
a substrate;
an electric circuit arranged on the substrate;
wherein the electric circuit includes a power semiconductor component and a capacitor;
a conductor frame including a DC+ busbar and a DC− busbar for external contact; and
an encapsulation material at least partially encapsulating the power semiconductor module;

wherein the capacitor is fastened on the DC+ busbar and the DC− busbar in thermal contact with a heat dissipator extending through the substrate.

* * * * *